US008736966B2

(12) United States Patent
Sasamuro et al.

(10) Patent No.: US 8,736,966 B2
(45) Date of Patent: May 27, 2014

(54) LIGHT SOURCE DEVICE HAVING LASER DEVICES WITH STEM AND CAP

(75) Inventors: Takashi Sasamuro, Yamato (JP); Yukitoshi Marutani, Tokyo-to (JP)

(73) Assignee: Nichia Corporation, Anan-Shi (JP)

( * ) Notice: Subject to any disclaimer, the term of this patent is extended or adjusted under 35 U.S.C. 154(b) by 21 days.

(21) Appl. No.: 13/425,449

(22) Filed: Mar. 21, 2012

(65) Prior Publication Data

US 2012/0243105 A1    Sep. 27, 2012

(30) Foreign Application Priority Data

Mar. 22, 2011  (JP) .................................. 2011-63390

(51) Int. Cl.
*G02B 27/30* (2006.01)
*G02B 3/00* (2006.01)

(52) U.S. Cl.
CPC .............. *G02B 27/30* (2013.01); *G02B 3/0056* (2013.01); *G02B 3/0062* (2013.01)
USPC ............................ 359/641; 359/621; 359/622

(58) Field of Classification Search
CPC ...... G02B 27/20; G02B 27/30; G02B 3/0056; G02B 5/001; H01S 5/18311; H01S 5/4031; H01S 5/0264
USPC .................. 372/50.12, 50.21, 50.23, 50.124; 359/641–642, 620–623, 709, 18; 362/268, 249.02, 259, 311.02
See application file for complete search history.

(56) References Cited

U.S. PATENT DOCUMENTS

| | | | |
|---|---|---|---|
| 4,942,584 A * | 7/1990 | Karaki et al. ..................... 372/9 |
| 5,997,152 A | 12/1999 | Taninaka et al. | |
| 7,830,609 B2 * | 11/2010 | Inoue et al. .................... 359/641 |
| 2002/0090172 A1 | 7/2002 | Okazaki et al. | |
| 2005/0073750 A1 * | 4/2005 | Takahashi et al. ............ 359/668 |
| 2009/0122416 A1 | 5/2009 | Inoue et al. | |
| 2010/0320483 A1 | 12/2010 | Kadotani et al. | |

FOREIGN PATENT DOCUMENTS

| | | |
|---|---|---|
| JP | 2002-202442 A | 7/2002 |
| JP | 2005-114977 A | 4/2005 |
| JP | 2009-80468 A | 4/2009 |

OTHER PUBLICATIONS

English language version of a European Search Report issued in co-pending European Application No. 12 15 9753 on Jul. 16, 2013.
Reply to the Opinion of the extended European Search Report for co-pending European Application No. 12 15 9753 dated Mar. 19, 2013.

* cited by examiner

*Primary Examiner* — Ricky Mack
*Assistant Examiner* — Daniele Manikeu
(74) *Attorney, Agent, or Firm* — Birch, Stewart, Kolasch & Birch, LLP

(57) ABSTRACT

A light source device includes a light source main unit made of a combination of a plurality of semiconductor laser devices, a plurality of collimator lens respectively capable of converting light beams emitted by the respective semiconductor laser devices of the light source main unit to respective approximately parallel light beam fluxes, and a condenser lens capable of condensing light beam fluxes emitted by the plurality of collimator lenses. The light source main unit has the plurality of semiconductor laser devices arranged, when viewed from the condenser lens, so that the stems of the adjacent semiconductor laser devices are seemingly continuous in a first direction perpendicular to the optical axis of the condenser lens, and the stems of the adjacent semiconductor laser devices are overlapped in a second direction perpendicular to both the direction of optical axis and the first direction.

8 Claims, 10 Drawing Sheets

(a)

(b)

(a)

(b)

(c)

LIGHT SOURCE DEVICE HAVING LASER DEVICES WITH STEM AND CAP

CROSS-REFERENCE TO RELATED APPLICATION

The present application claims priority under 35 U.S.C. §119 to Japanese Patent Application No. 2011-63390 filed on Mar. 22, 2011. The content of which is hereby incorporated by reference in its entirety.

BACKGROUND OF THE INVENTION

1. Field of the Invention

The present invention relates to a light source device.

2. Description of Related Art

There has been proposed is a light source device in which light emitted from a plurality of semiconductor laser devices is collimated into substantially parallel light by a plurality of collimator lenses and then condensed by a condenser lens (see JP 2009-80468A, JP 2005-114977A, and JP 2002-202442A, for example).

RELATED ART REFERENCE

Patent Reference

Patent Reference 1: JP 2009-80468A
Patent Reference 2: JP 2005-114977A
Patent Reference 3: JP 2002-202442A However, in recent years, there is a demand for a new, small-sized light source device that is different from the conventional light source devices.

SUMMARY OF THE INVENTION

It is therefore an object of the present invention is to provide a new, small-sized light source device that is different from the conventional light source devices.

According to the present invention, the problems described above can be solved by the means described below.

The present invention concerns a light source device having a light source main unit made of a combination of a plurality of semiconductor laser devices, a plurality of collimator lenses arranged respectively corresponding to the plurality of the semiconductor laser devices of the light source main unit and respectively capable of converting light beams emitted from the respective semiconductor laser devices of the light source main unit into approximately parallel light beam fluxes, and a condenser lens capable of condensing light beam fluxes emitted by the plurality of collimator lenses. The semiconductor laser device includes a semiconductor laser element and an I-shape package having a stem and a cap. The light source main unit has the plurality of semiconductor laser devices arranged such that, when viewed from the condenser lens, the stems of the adjacent semiconductor laser devices are seemingly continuous in a first direction which is a direction perpendicular to the optical axis of the condenser lens, and the stems and the caps of the adjacent semiconductor laser devices are overlapped in a second direction perpendicular to both the direction of optical axis and the first direction.

The present invention also concerns a light source device which includes a light source main unit having a semiconductor laser device having an approximately elliptical emission region whose long axis is inclined at an angle of 45 degrees with respect to a direction approximately in parallel to the I-shape.

The present invention also concerns a light source device which includes a light source main unit having a semiconductor laser device having an approximately elliptical emission region whose long axis is approximately in parallel to the I-shape and having a semiconductor laser device having an approximately elliptical emission region whose long axis is approximately perpendicular to the I-shape.

The present invention also concerns a light source device as described above which has an intensity distribution of the beam spot in a single-peaked shape.

The present invention also concerns a light source device as described above which has an intensity distribution of the beam spot in a top hat shape.

According to the present invention, a new, small-sized light source device can be provided.

BRIEF DESCRIPTION OF THE DRAWINGS

FIGS. 9(a) and 2(b) are diagrams each showing an example of configuration of a light source main unit according to a second embodiment of the present invention.

FIG. 10(a) a light source main unit according to a first embodiment of the present invention, FIG. 10(b) a light source main unit according to a second embodiment of the present invention, and FIG. 10(c) a light source main unit according to a comparative example.

DETAILED DESCRIPTION OF PREFERRED EMBODIMENTS

Preferred embodiments of the present invention will be described below with reference to the accompanying drawings.

(Light Source Device According to First Embodiment of the Present Invention)

Figure 1:
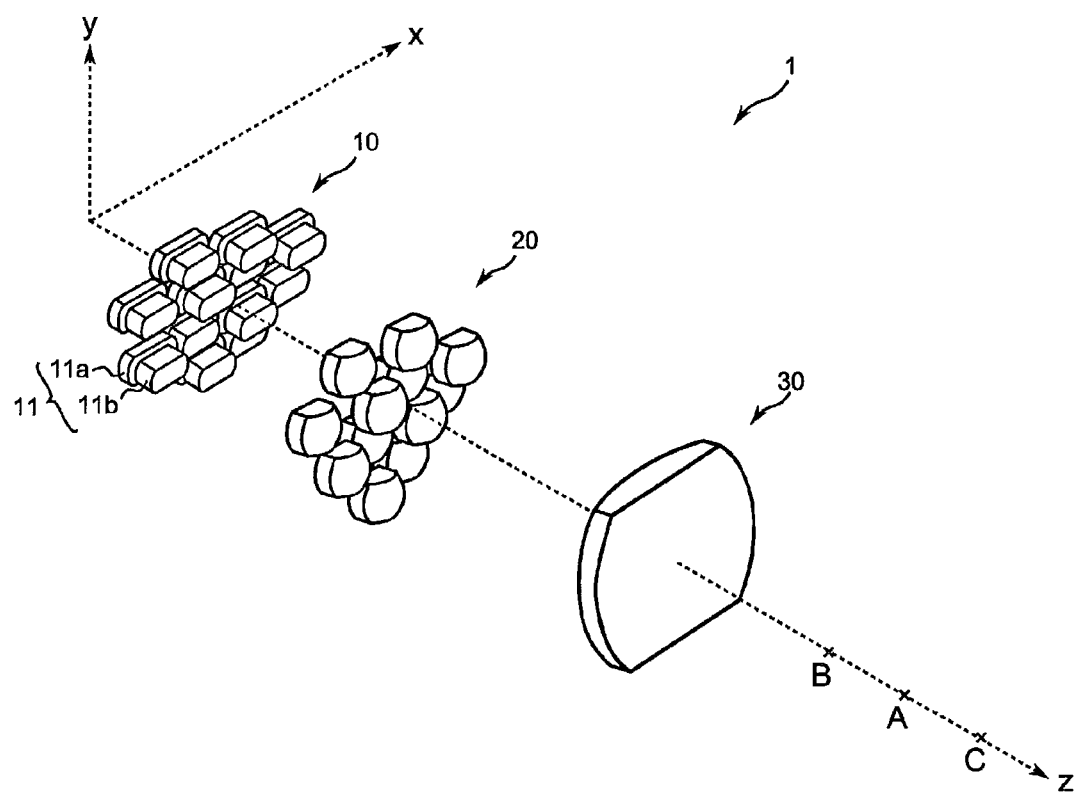
FIG. 1 is a schematic perspective view of a light source device according to a first embodiment of the present invention.

FIG. 1 is a schematic perspective view of a light source device according to a first embodiment of the present invention.

As shown in FIG. 1, a light source device 1 according to the first embodiment of the present invention includes a light source main unit 10 made of a combination of a plurality of semiconductor laser devices 11, a plurality of collimator lenses 20 for respectively converting light beams emitted by the respective semiconductor laser devices of the light source main unit 10 to respective approximately parallel light beam fluxes, and a condenser lens 30 for condensing light beam fluxes emitted by the plurality of collimator lenses 20.

Figure 2:
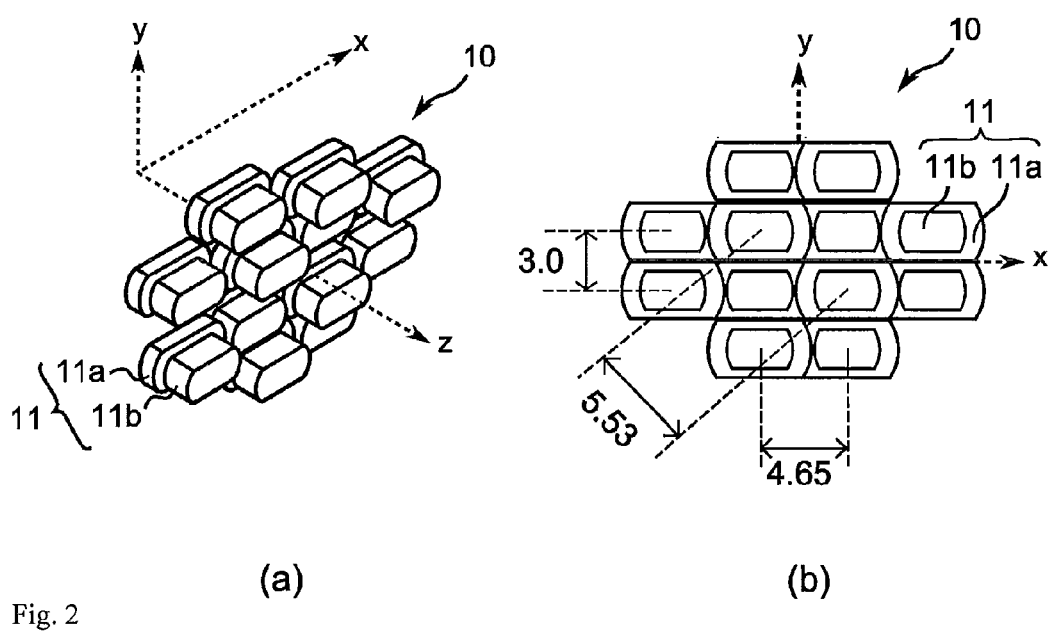
FIGS. 2(a) and 2(b) are diagrams each showing an example of configuration of a light source main unit according to a first embodiment of the present invention.

FIGS. 2(a) and 2(b) are diagrams each showing an example of configuration of a light source main unit according to the first embodiment of the present invention. FIG. 2(a) shows a schematic perspective view of a light source main unit, and FIG. 2(b) shows a view of the light source main unit seen from the condenser lens.

As shown in FIGS. 2(a) and 2(b), each of the light source main units 10 is made of a combination of a plurality of semiconductor laser devices 11, and each of the semiconductor laser devices 11 includes an I-shaped package having a stem 11a and a cap 11b. In each of the packages, a semiconductor laser element (not shown) is housed.

In the light source main unit 10, a plurality of semiconductor laser devices are arranged in a staggered manner in a front and back direction when viewed from the condenser lens 30 so that the stems 11a of adjacent semiconductor laser devices 11 are seemingly continuous in a first direction (Y direction) which is perpendicular to a direction of the optical axis (Z direction) of the condenser lens 30. In the present specification, an emission direction of laser beam from a semiconductor laser device 11 is referred to as "front", and the opposite direction of the emission direction is referred to as "back".

Also, in the light source main unit 10, a plurality of semiconductor laser devices 11 are arranged in a staggered manner in a front and back direction when viewed from the condenser lens 30 so that the stems 11a of adjacent semiconductor laser devices 11 are overlapped in a second direction (X direction) which is perpendicular to both the optical axis direction of the condenser lens 30 and the first direction (Y direction).

According to the first embodiment of the present invention, the light source unit 10 is made of a combination of a plurality of semiconductor laser devices 11 each having an I-shaped package, in which the plurality of semiconductor laser devices 11 are arranged in a stagger manner in a front and back direction so that the stems 11a of adjacent semiconductor laser devices 11 are overlapped in the second direction (X direction) of the light source main unit 10.

Accordingly, according to the first embodiment of the present invention, the plurality of semiconductor laser devices 11 are arranged close to each other in the optical axis direction (Z direction) of the condenser lens 30, so that the light source main unit 10 can be small-sized, which enables realization of a new small-sized light source device 1.

Moreover, downsizing of the light source main unit 10 enables downsizing of the condenser lens 30, so that a light source device can be manufactured at a lower cost. Further, using a small-sized condenser lens 30 allows a reduction of the refractive index of outermost incident light which reduce the aberration, which enables obtaining of a high quality beam spot.

Now, the light source main unit will be described more particularly below.

Figure 3:
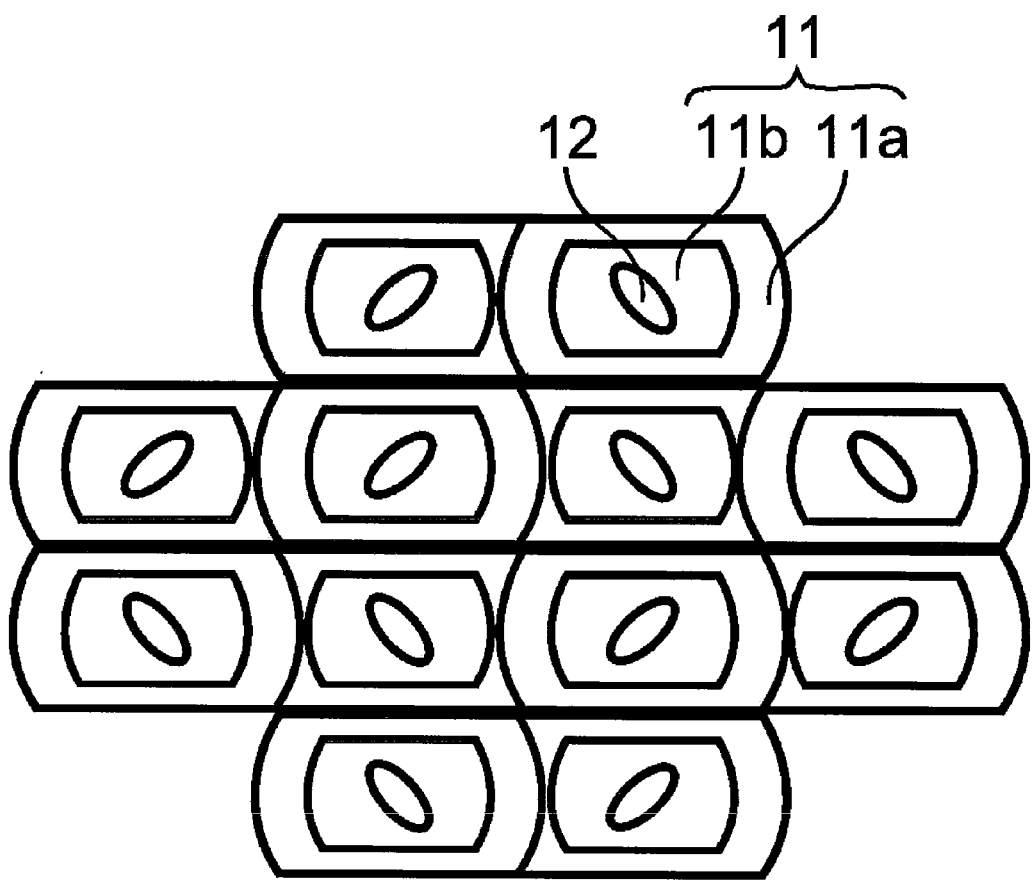
FIG. 3 is a diagram showing a light source main unit (First type) according to a first embodiment of the present invention.

FIG. 3 is a diagram showing a light source main unit (First type) according to a first embodiment of the present invention. As shown in FIG. 3, in a light source main unit (First type) according to the first embodiment of the present invention, each of the semiconductor laser devices 11 has an approximately elliptical emission region 12 whose long axis is inclined at an angle of 45 degrees with respect to a direction approximately in parallel to the I-shape.

Figure 4:
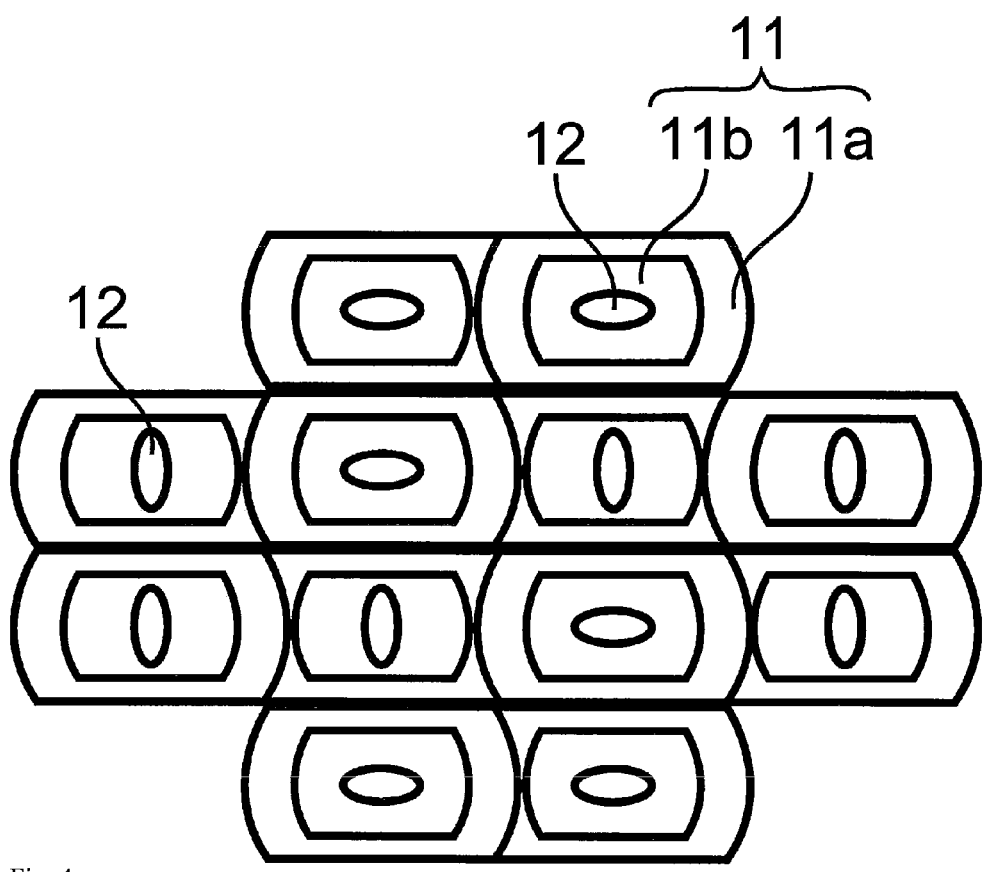
FIG. 4 is a diagram showing a light source main unit (Second type) according to a first embodiment of the present invention.

FIG. 4 is a diagram showing a light source main unit (Second type) according to a first embodiment of the present invention. As shown in FIG. 4, in a light source main unit (Second type) according to the first embodiment of the present invention, each of the semiconductor laser devices 11 has an approximately elliptical emission region 12 whose long axis is approximately in parallel with or perpendicular to the I-shape.

Figure 5:
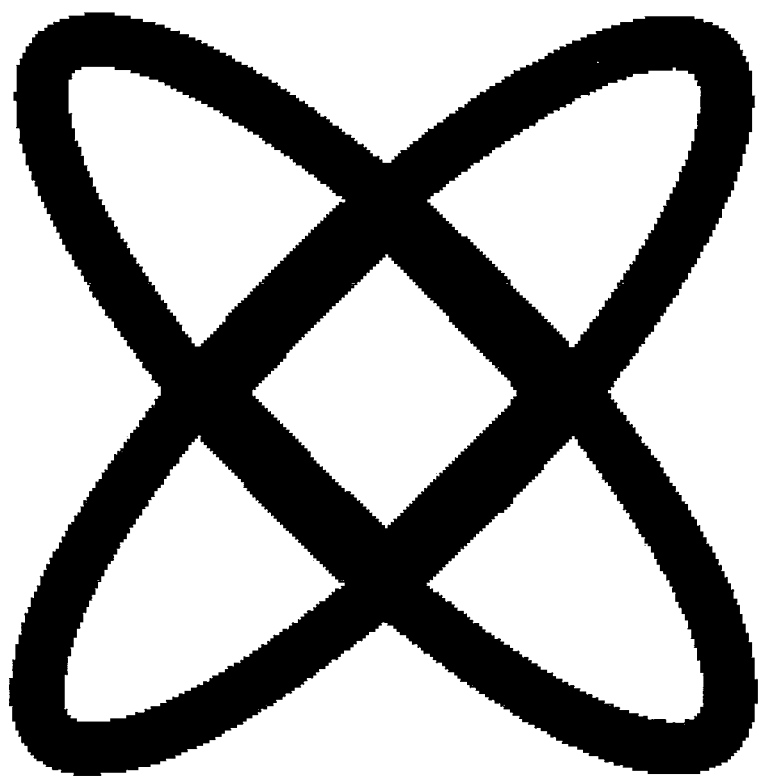
FIG. 5 is a diagram showing a general shape of a beam spot at a focal point "A" formed by using a light source main unit (First type) or a light source main unit (Second type) according to a first embodiment of the present invention.

FIG. 5 is a diagram showing a general shape of a beam spot at a focal point A formed by using a light source main unit (First type) or a light source main unit (Second type) according to a first embodiment of the present invention.

As shown in FIG. 5, using either the light source main unit (First type) or the light source main unit (Second type) of the first embodiment of the present invention enables obtaining of a beam spot in a X-shape at the focal point A.

Accordingly, all the laser beams emitted from a plurality of semiconductor laser devices 11 overlap at the center region of the beam spot, and only partially overlap in the peripheral area of the center region of the beam spot.

Therefore, in the case where the laser beams at the center region of the beam spot, using either the light source main unit (First type) or the light source main unit (Second type) according to the first embodiment of the present invention enables prevention of such as unintended irradiation of the laser beam at the peripheral area of the center region of the beam spot on an object, so that a beam spot of high quality can be obtained.

Figure 6:
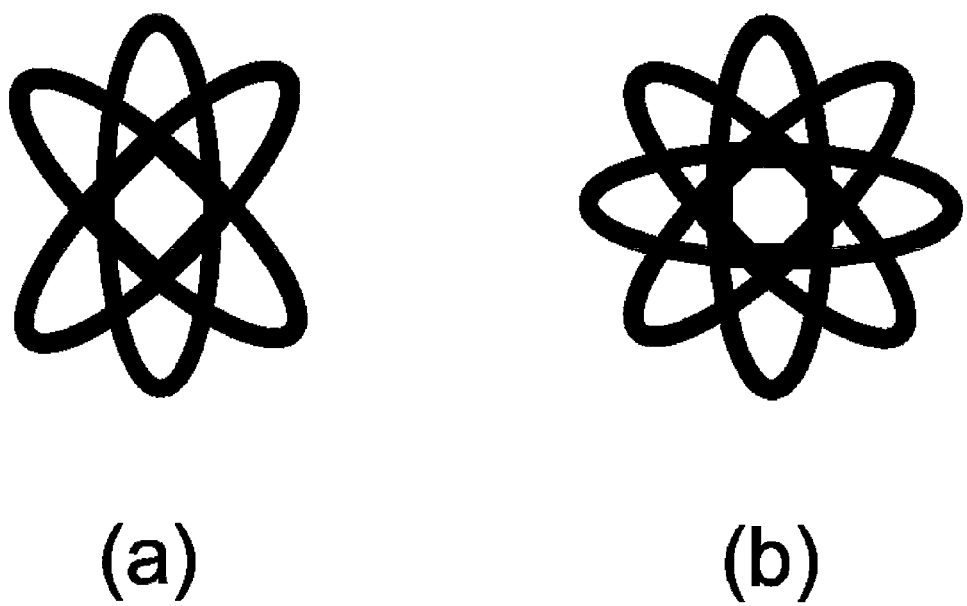
FIGS. 6(a) and (b) are diagrams each schematically showing a general shape of a beam spot at a focal point A formed by using a light source main unit (another example) according to a first embodiment of the present invention.

FIGS. 6(a) and (b) are diagrams each schematically showing a general shape of a beam spot at a focal point A formed by using a light source main unit (another example) according to the first embodiment of the present invention.

In addition to the configurations described above, according to the first embodiment of the present invention, variously changing the inclination of the emission region of each of the semiconductor laser devices 11 with respect to the I-shape enables the laser beams emitted from the plurality of semiconductor laser devices 11 to be much less overlapped at the peripheral area of the center region of the beam spot, as shown in FIG. 6(a) and FIG. 6(b). [0035] Although not shown, according to the first embodiment of the present invention, variously changing the inclination of the emission region of each of the semiconductor laser devices 11 with respect to the I-shape also enables the laser beams emitted from the plurality of semiconductor laser devices 11 not to be overlapped at all at the peripheral area of the center region of the beam spot.

Figure 7:
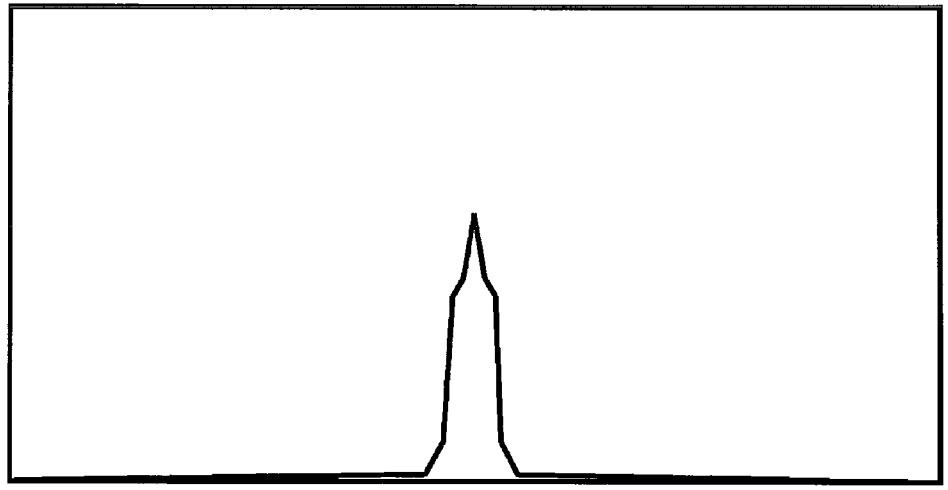
FIGS. 7(a) and 7(b) are diagrams each showing an intensity distribution of a beam spot generated by a light source device according to a first embodiment of the present invention.
Figure 7:
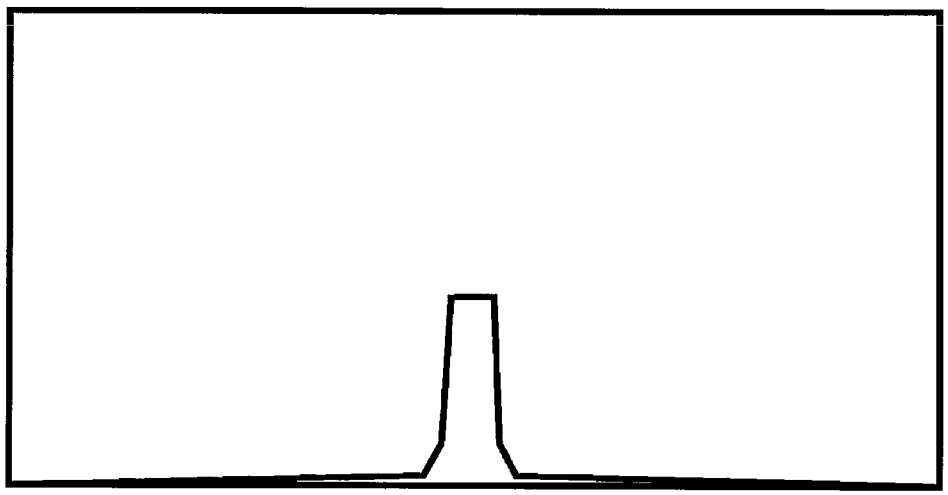

FIGS. 7(*a*) and 7(*b*) are diagrams each showing an intensity distribution of a beam spot generated by a light source device according to the first embodiment of the present invention. FIG. 7(*a*) shows the intensity distribution of the beam spot at the focal point A and FIG. 7(*b*) shows the intensity distribution of the beam spot at the point B and the point C.

As shown in FIG. 7(*a*), according to the first embodiment of the present invention, a beam spot having an intensity distribution in a single-peak shape can be obtained at the focal point A.

As shown in FIG. 7(*b*), according to the first embodiment of the present invention, a beam spot having an intensity distribution in a top hat shape can be obtained at the point B and the point C.

(Light Source Device According to Second Embodiment of the Present Invention)

Figure 8:
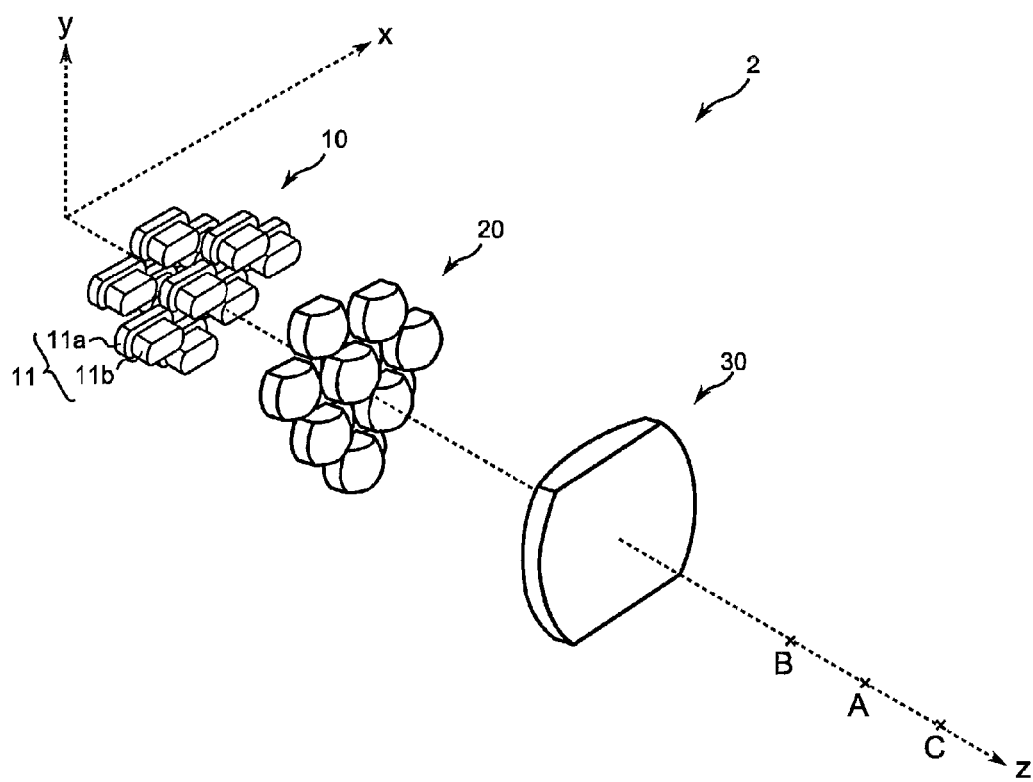
FIG. 8 is a schematic perspective view of a light source device according to a second embodiment of the present invention.
Figure 9:
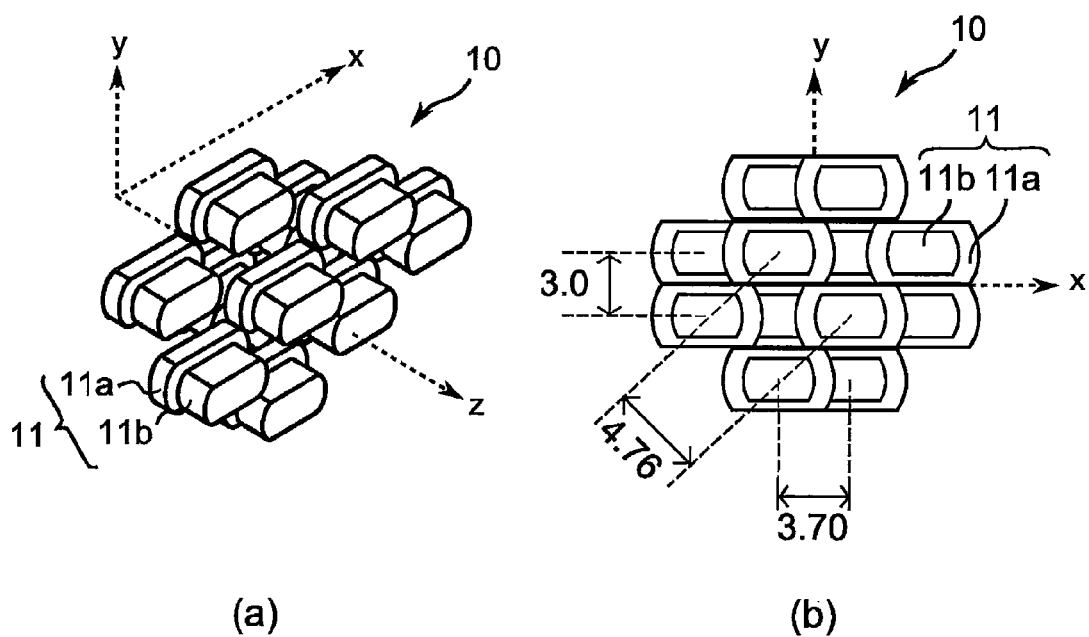

FIG. 8 is a schematic perspective view of a light source device according to the second embodiment of the present invention. FIGS. 9(*a*) and 9(*b*) are diagrams each showing an example of configuration of a light source main unit according to the first embodiment of the present invention. FIG. 9(*a*) shows a schematic perspective view of alight source main unit, and FIG. 9(*b*) shows a view of the light source main unit seen from the condenser lens.

As shown in FIG. 8 and FIG. 9, the light source device 2 of the present invention has a configuration different than that in the light source device 1 according to the first embodiment of the present invention. That is, when the light source main unit 10 is viewed from the condenser lens 30, a plurality of semiconductor laser devices are arranged in a staggered manner in a front and back direction so that the stems 11*a* and the caps 11*b* of the adjacent semiconductor laser devices 11 are overlapped in a second direction (X direction) perpendicular to both the direction of optical axis (Z direction) of the condenser lens 30 and the first direction (Y direction).

According to the second embodiment of the present invention, the plurality of semiconductor laser devices 11 are arranged close to each other in the second direction (X direction) which is perpendicular to both the optical axis direction (Z direction) of the condenser lens 30 and the first direction (Y direction), so that the light source main unit 10 can be small-sized, which enables to realize a new, small-sized light source device 2.

According to the second embodiment, as in the first embodiment, downsizing of the light source main unit also enables downsizing of the condenser lens 30. Thus enables manufacturing of the light source devices at a lower cost. Also, use of the small-sized condenser lens 30 allows reduction of the refractive index of the outermost incident light to reduce the aberration, thus a beam spot of high quality can be obtained.

Figure 10:
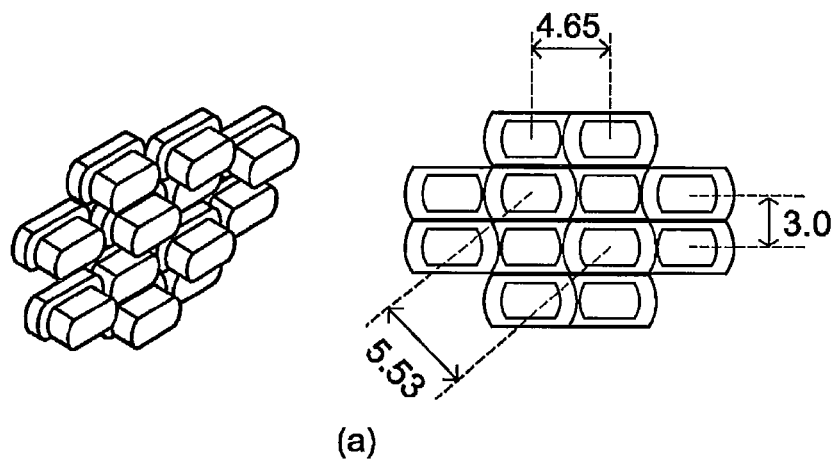
FIGS. 10(a) to 10(c) are diagrams comparing.
Figure 10:
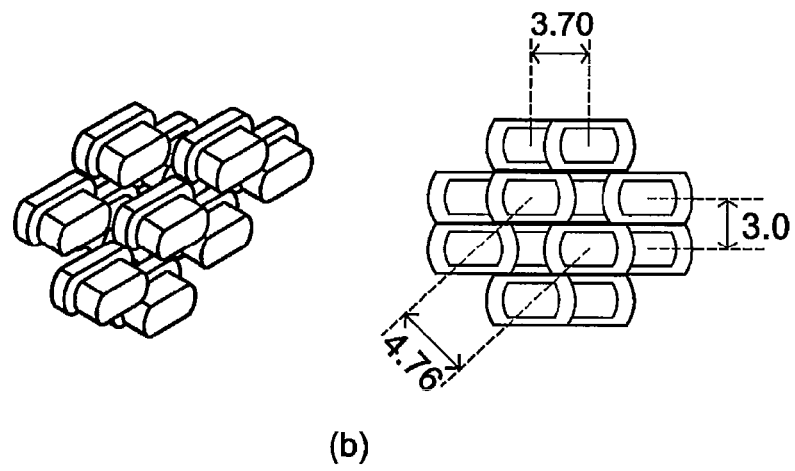
Figure 10:
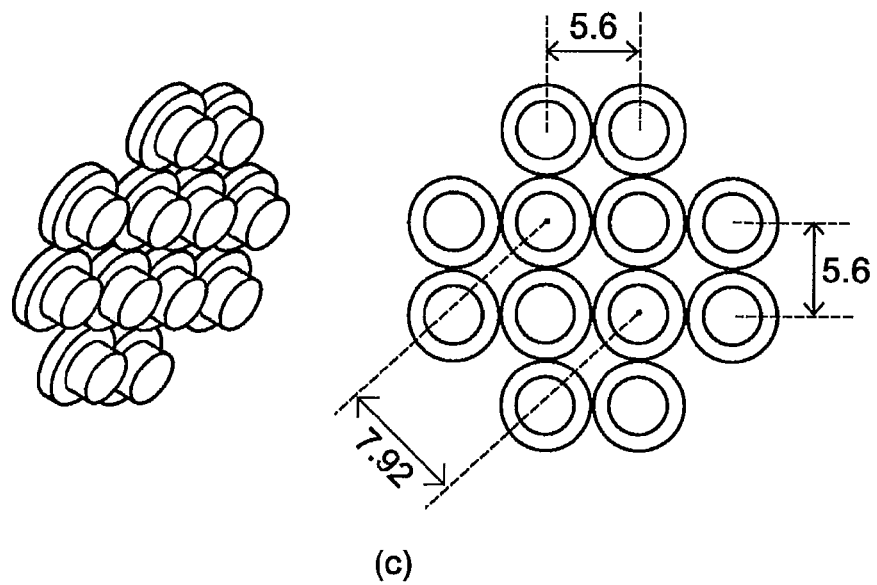

FIGS. 10(*a*) to 10(*c*) are diagrams comparing a light source main unit according to a first embodiment of the present invention (FIG. 10(*a*)), a light source main unit according to a second embodiment of the present invention (FIG. 10(*b*)), and a light source main unit according to a comparative example (FIG. 10(*c*)).

As shown in FIG. 10(*a*), with the light source main unit 10 according to the first embodiment of the present invention, the intervals between the centers of adjacent semiconductor laser devices 11 may be 4.65 mm in the X direction, 3 mm in the Y direction, and 5.53 mm in an oblique direction.

As shown in FIG. 10(*b*), with the light source main unit 10 according to the second embodiment of the present invention, the intervals between the centers of adjacent semiconductor laser devices 11 may be 3.7 mm in the X direction, 3 mm in the Y direction, and 4.76 mm in an oblique direction.

In contrast to those, as shown in FIG. 10(*c*), with the light source main unit according to the comparative embodiment, the intervals between the centers of adjacent semiconductor laser devices may be 5.6 mm in the X direction, 5.6 mm in the Y direction, and 7.92 mm in an oblique direction.

As described above, in the light source main unit 10 according to the first embodiment of the present invention and the light source main unit 10 according to the second embodiment of the present invention, in all the X-direction, Y-direction, and oblique direction, the intervals between adjacent semiconductor laser devices 11 are smaller than that of the corresponding intervals of the light source main unit of the comparative example.

In the disclosure above, there is described only the preferred embodiments of the present invention and but a few examples of its versatility. It is to be understood that the present invention is not limited thereto but may be variously embodied to practice within the scope of the present invention.

DENOTATION OF REFERENCE NUMERALS

1, 2 . . . light source device
10 . . . light source main unit
11 . . . semiconductor laser device
11*a* . . . stem
11*b* . . . cap
12 . . . emission region
20 . . . collimator lens
30 . . . condenser lens
A . . . focal point
B, C . . . point

What is claimed is:

1. A light source device comprising:
a light source main unit made of a combination of a plurality of semiconductor laser devices;
a plurality of collimator lenses respectively capable of converting light beams emitted by the respective semiconductor laser devices of the light source main unit to respective approximately parallel light beam fluxes; and
a condenser lens capable of condensing light beam fluxes emitted by the plurality of collimator lenses; wherein
the semiconductor laser device includes a semiconductor laser element and an I-shape package having a stem and a cap, and
the light source main unit has the plurality of semiconductor laser devices arranged such that, when viewed from the condenser lens, the stems of the adjacent semiconductor laser devices are seemingly continuous in a first direction which is a direction perpendicular to the optical axis of the condenser lens, and the stems of the adjacent semiconductor laser devices are overlapped in a second direction perpendicular to both the direction of optical axis and the first direction.

2. A light source device comprising:
a light source main unit made of a combination of a plurality of semiconductor laser devices;
a plurality of collimator lenses respectively capable of converting light beams emitted by the respective semiconductor laser devices of the light source main unit to respective approximately parallel light beam fluxes; and
a condenser lens capable of condensing light beam fluxes emitted by the plurality of collimator lenses; wherein
the semiconductor laser device includes a semiconductor laser element and an I-shape package having a stem and a cap, and the light source main unit has the plurality of semiconductor laser devices arranged such that, when viewed from the condenser lens, the stems of the adjacent semiconductor laser devices are seemingly continuous in a first direction which is a direction perpendicular to the optical axis of the condenser lens, and the stems and the caps of the adjacent semiconductor laser devices are overlapped in a second direction perpendicular to both the direction of optical axis and the first direction.

3. The light source device according to claim 1 or claim 2, wherein the light source main unit has a semiconductor laser device having an approximately elliptical emission region whose long axis is inclined at an angle of 45 degrees with respect to a direction approximately in parallel to the I-shape.

4. The light source device according to claim 1 or claim 2, wherein the light source main unit has a semiconductor laser device having an approximately elliptical emission region whose long axis is approximately in parallel to the I-shape and has a semiconductor laser device having an approximately elliptical emission region whose long axis is approximately perpendicular to the I-shape.

5. The light source device according to claim 1, wherein an intensity distribution of the beam spot has a single-peak shape.

6. The light source device according to claim 1, wherein an intensity distribution of the beam spot has a top hat shape.

7. The light source device according to claim 2, wherein an intensity distribution of the beam spot has a single-peak shape.

8. The light source device according to claim 2, wherein an intensity distribution of the beam spot has a top hat shape.

* * * * *